United States Patent
Billiet et al.

(12)

(10) Patent No.: US 6,838,047 B2
(45) Date of Patent: Jan. 4, 2005

(54) MEMS AND MEMS COMPONENTS FROM SILICON KERF

(76) Inventors: Romain Louis Billiet, 135A Malacca Street, Penang (MY), 10400; Hanh Thi Nguyen, 135A Malacca Street, Penang (MY), 10400

(*) Notice: Subject to any disclaimer, the term of this patent is extended or adjusted under 35 U.S.C. 154(b) by 121 days.

(21) Appl. No.: 10/231,880

(22) Filed: Aug. 23, 2002

(65) Prior Publication Data

US 2003/0044302 A1 Mar. 6, 2003

Related U.S. Application Data

(60) Provisional application No. 60/318,398, filed on Sep. 3, 2001, and provisional application No. 60/315,015, filed on Aug. 28, 2001.

(51) Int. Cl.$^7$ .................................................. B22F 3/16
(52) U.S. Cl. ............................ 419/36; 419/38; 423/324
(58) Field of Search ...................... 419/36, 38; 423/324

(56) References Cited

U.S. PATENT DOCUMENTS

| 4,261,781 A | * | 4/1981 | Edmonds et al. ............ 438/458 |
| 4,375,453 A | * | 3/1983 | Nalewajek et al. ......... 423/21.1 |
| 4,515,755 A | * | 5/1985 | Matsuo et al. .............. 117/208 |
| 5,830,369 A | * | 11/1998 | Toyama ...................... 210/773 |
| 6,059,118 A | * | 5/2000 | Ding et al. .................. 209/164 |
| 6,113,473 A | * | 9/2000 | Costantini et al. ............ 451/60 |
| 6,702,994 B1 | * | 3/2004 | Henriksen et al. .......... 423/337 |

FOREIGN PATENT DOCUMENTS

JP    10182124    *  7/1998

* cited by examiner

*Primary Examiner*—Ngoclan T. Mai
(74) *Attorney, Agent, or Firm*—Foley & Lardner

(57) ABSTRACT

The disclosure describes an economical and environmentally benign method for using crystalline silicon metal kerf recovered from wiresaw slurries towards the fabrication of complex MEMS and MEMS components, including MEMS packages, with improved design features.

10 Claims, No Drawings

MEMS AND MEMS COMPONENTS FROM SILICON KERF

CROSS-REFERENCE TO RELATED APPLICATIONS

This application claims priority to U.S. Provisional Patent Application Ser. No. 60/318,398 filed on Sep. 3, 2001 and claims benefit from co-pending U.S. Provisional Patent Application Ser. No. 60/315,015 filed on Aug. 28, 2001 entitled 'Photovoltaic Cells From Silicon Kerf'.

REFERENCES CITED

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND—FIELD OF INVENTION

The present invention relates to silicon-based Micro-Electro-Mechanical Systems (MEMS) and MEMS components.

BACKGROUND—DESCRIPTION OF PRIOR ART

Micro-Electro-Mechanical Systems (MEMS), the technology of integrating mechanical elements, sensors, actuators and electronics into complex micrometer-sized machines—also referred to as micromachines and microsystems technology (MST)—has matured into a ubiquitous and pervasive technology used for a fast growing number of high-volume commercial applications such as automotive airbag sensors, micromotors, actuators, sensors, heat exchangers, filters, microvalves and pumps, medical instruments, biomedical implants, avionics equipment, etc.

Today's MEMS manufacturing technology is based virtually exclusively on the high volume, batch processing methodologies of the integrated circuit (IC) industry and therefore, like ICs, MEMS devices are made from silicon.

The most basic method used to fabricate MEMS devices is to successively deposit and etch thin films of structural polycrystalline silicon layers, each about 2–4 micrometers thick. With each deposition/etch cycle protrusions, holes or undercuts are created. Typical applications for this method range from simple mirrors to actuators, electrostatic motors and complex accelerometers such as the ones used in airbag deployment. The use of thin films is often cited as the major limitation to the development of MEMS devices while the deposition/etch cycles restrict design freedom.

Because MEMS technology uses the costly IC fabrication processes, it is not universally accessible today and many companies desirous to explore the potential of MEMS technology have limited options for getting devices prototyped or manufactured. Advanced simulation and modelling tools for MEMS design are also lacking, resulting in a relatively inaccurate prediction of dimensional accuracy. As a result, the MEMS design process is usually performed in a trial-and-error fashion, requiring several iterations before the specification requirements are satisfied. This non-ideal design methodology combined with the length of time and high cost associated with MEMS prototyping results in a very inefficient and ineffective scenario of commercial product development.

One of the most serious obstacles to the development of commercial MEMS applications is their packaging. MEMS packaging is much more complicated than microelectronics packaging due to the diversity of MEMS devices and the requirement that they be in continuous and intimate contact with their environment. Presently, virtually any new MEMS development requires that an ad hoc package be designed. Consequently, most companies find that packaging is the single most expensive and time consuming task in their MEMS development programs. The cost of the package is a sizeable part of the total cost of a MEMS component, often ranging from 20–95% of the product's total cost. In addition, the size of a MEMS device is often dwarfed by the size of its final package. A sensing or actuating element of a few microns can end up in a package with an overall size in centimeters. As a result, the benefits of miniaturization are often lost because of inadequate packaging. The high cost and the undesirable bulky packages are major stumbling blocks in capitalizing the market potential of MEMS products.

A more recent new but general problem plaguing the IC, photovoltaics (PV) and MEMS industries is the growing shortage of silicon which has already caused the price of polysilicon to double over the past six or seven years.

BRIEF SUMMARY OF THE INVENTION

In accordance with the present invention many of the problems of the prior art are substantially overcome by recovering crystalline silicon metal from sawing kerf generated during wiresaw cutting of single crystal silicon ingots and wafers and compounding said recovered silicon metal kerf into a thermoplastic molding feedstock. The thus obtained silicon metal feedstock is molded into green MEMS or MEMS components from which the organic binder is extracted. The resulting binder-free MEMS or MEMS component preforms are then sintered in accordance with prior art practices.

OBJECTS AND ADVANTAGES

It is a primary object and advantage of this invention to provide an economic, simple, energy and material efficient process to mass-produce MEMS and MEMS components from silicon kerf, thereby obviating the costly IC manufacturing processes currently used to fabricate MEMS.

Another advantage of this invention resides in the savings resulting from the use of silicon kerf—itself a waste from another industry—as raw material for MEMS and MEMS components.

It is also an object of this invention to provide a waste-free method to fabricate MEMS and MEMS components since the thermoplastic silicon kerf molding compound made in accordance with this invention is 100% recyclable.

Still another advantage of this invention is to overcome the design limitations of the prior art by providing a method to fabricate MEMS and MEMS components with complex design features such as deep holes, rounded shapes, angled slots, threaded holes, etc., not achievable via the IC manufacturing processes currently used to fabricate MEMS.

Yet another advantage of this invention is to overcome the dimensional limitations of the prior art by the use of submicrometer-sized particles of silicon kerf thus allowing the achievement of the extremely fine design features and high definition demanded by advanced MEMS applications.

It is still another object of this invention to provide a method to fabricate MEMS and MEMS components without the trial and error methods and iterations of the prior art in order to arrive at the correct final dimensions.

A still further object of this invention is to provide a manufacturing process for MEMS and MEMS components which lends itself easily to automated mass-production as it makes use of well-established prior art techniques such as casting, machining, molding, sintering, etc.

BRIEF DESCRIPTION OF THE SEVERAL VIEWS OF THE DRAWINGS

Not applicable.

DETAILED DESCRIPTION OF THE INVENTION

One untapped source of silicon is silicon kerf, the waste material generated when single crystal silicon ingots are sawed into wafers and wafers into individual chips. Depending on wafer thickness, kerf loss represents from 25–50 percent of the total ingot.

In the present inventors' co-pending U.S. Provisional Patent Application No. 60/315,015, a method is disclosed to recover silicon kerf from wiresaw slurries and to use said recovered silicon kerf to produce photovoltaic cells. The same recovered silicon kerf is also an ideal raw material for the fabrication of silicon-based MEMS and MEMS components. The fine granulometry of the thus recovered silicon kerf is likely to shift further into the sub-micrometer range as finer wiresaw wires are being developed. This is particularly beneficial to the application of this invention as sub-micrometer particles contribute to achieving the extremely small design features and improved definition required in MEMS and MEMS components with.

As in U.S. Provisional Patent Application No. 60/315,015, the silicon kerf concentrate obtained by froth flotation or other concentration methods is mixed with an organic thermoplastic compound or binder in order to produce a silicon kerf molding compound which is then shaped into green MEMS and MEMS components by well-known prior art techniques such as plastics injection molding, casting, doctor blading and punching or calendering.

It should be noted here that, in order to obtain the dimensions of the molds, dies or punches used to form the green MEMS or MEMS components, the desired final dimensions of the proposed MEMS or MEMS components are multiplied by a factor commensurate with the shrinkage upon sintering.

The organic binder is extracted from the green MEMS and MEMS components using well-known prior art techniques such as aqueous or organic solvent extraction, oxidative degradation, catalytic decomposition, vacuum distillation, wicking and the like, leaving behind a framework substantially devoid of organic material and substantially consisting of silicon metal particulates only. This binder-free structures can then be sintered into their final dense end configuration in accordance using prior art sintering techniques.

CONCLUSION, RAMIFICATIONS AND SCOPE

In conclusion, the present invention provides an economical and environmentally benign method to fabricate technically advanced silicon-based MEMS and MEMS components.

Though the invention has been described with respect to specific preferred embodiments thereof, many variations and modifications will immediately become apparent to those skilled in the art. Specifically, this invention is applicable to MEMS packages and many other complex-shaped precision parts. It is therefore the intention that the appended claims be interpreted as broadly as possible in view of the prior art to include all such variations and modifications.

We claim as our invention:

1. A method for producing Micro-Electro-Mechanical Systems (MEMS) and MEMS components from crystalline silicon kerf recovered from wiresaw slurries, comprising:

a. separating crystalline silicon kerf from wiresaw slurries b. mixing said separated crystalline silicon kerf with an organic thermoplastic binder to produce a silicon kerf molding compound c. shaping said silicon kerf molding compound into green MEMS or MEMS component geometries d. extracting substantially all the organic thermoplastic binder from the said green MEMS or MEMS component geometries e. sintering said MEMS or MEMS component geometries into dense end products.

2. The method of claim 1 wherein said silicon kerf is the by-product of wiresaw operations of crystalline silicon ingots or wafers.

3. The method of claim 1 wherein said silicon kerf is recovered from wiresaw slurries by froth flotation.

4. The method of claim 1 wherein said silicon kerf is recovered from wiresaw slurries by electrostatic precipitation.

5. The method of claim 1 wherein said silicon kerf has a particle size of 10 micrometers or less.

6. The method of claim 1 wherein the said MEMS components are packages.

7. The method of claim 1 wherein the MEMS or MEMS component geometries sintered into dense end products include deep holes.

8. The method of claim 1 wherein the MEMS or MEMS component geometries sintered into dense end products include rounded portions.

9. The method of claim 1 wherein the MEMS or MEMS component geometries sintered into dense end products include angled slots.

10. The method of claim 1 wherein the MEMS or MEMS component geometries sintered into dense end products include threaded holes.

\* \* \* \* \*